United States Patent [19]

Lamarche

[11] 4,093,926
[45] June 6, 1978

[54] SYSTEM FOR ADVANCING AN ELECTRICAL SIGNAL IN PHASE UNDER THE CONTROL OF AN EXTERNAL VOLTAGE MORE ESPECIALLY FOR AN ENGINE OF A MOTOR VEHICLE

[75] Inventor: Jean Luc Lamarche, Paris, France

[73] Assignee: Thomson-CSF, Paris, France

[21] Appl. No.: 771,324

[22] Filed: Feb. 23, 1977

[30] Foreign Application Priority Data

Feb. 27, 1976 France ................................ 76 05587

[51] Int. Cl.² ............................................. H03B 3/04
[52] U.S. Cl. ...................................... 331/11; 331/17
[58] Field of Search ................... 331/10, 11, 12, 16, 331/17; 332/19

[56] References Cited

U.S. PATENT DOCUMENTS

| | | | |
|---|---|---|---|
| 3,414,842 | 12/1968 | Broadhead, Jr. | 332/19 |
| 3,546,701 | 12/1970 | Kurth | 331/10 |
| 3,614,649 | 10/1971 | Gerig | 331/17 |
| 4,023,115 | 5/1977 | Nicolas | 331/17 |

*Primary Examiner*—John Kominski
*Attorney, Agent, or Firm*—Cushman, Darby & Cushman

[57] ABSTRACT

A frequency-independent phase advancing system controlled by an external voltage, including a control loop of which the return circuit comprise a phase lagging circuit controlled by the external voltage, said external voltage undergoing a correction by circuits compensating the effect of frequency upon the lagging circuit.

1 Claim, 2 Drawing Figures

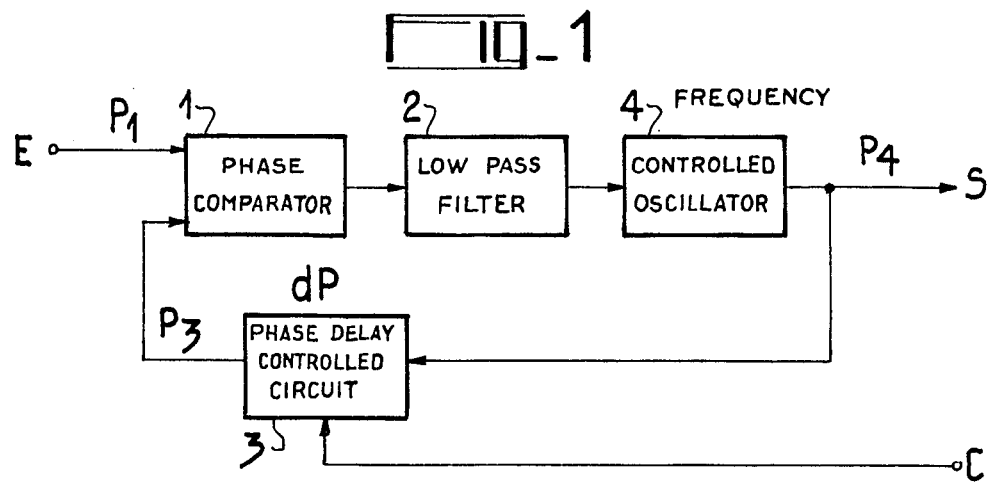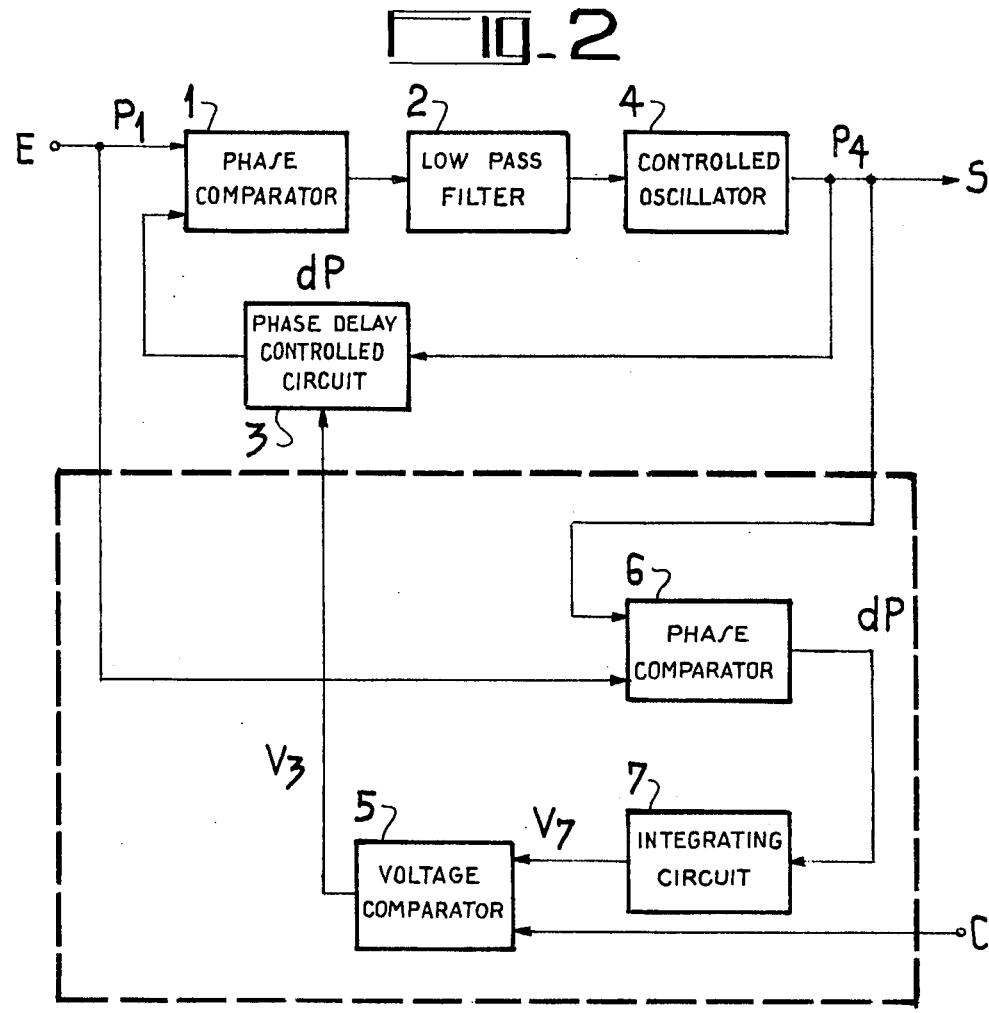

SYSTEM FOR ADVANCING AN ELECTRICAL SIGNAL IN PHASE UNDER THE CONTROL OF AN EXTERNAL VOLTAGE MORE ESPECIALLY FOR AN ENGINE OF A MOTOR VEHICLE

This invention relates to a system for advancing an electrical signal in phase under the control of an external voltage and, more particularly, to a phase advancing system where the external control voltage is supplied by a sensor which is sensitive to a phenomenon in dependence upon which the phase lead is to be determined.

Although it is known that a phase lag may readily be created in dependence upon a voltage, known systems for creating a phase lead are attended by numerous serious disadvantages. In particular, they have a complexity which makes them expensive, complex and cumbersome to the detriment of their reliability.

The present invention relates to a phase advancing system which is of simple construction and, in addition, is independent of the frequency of the signals to be phase-shifted.

To this end, there is used a controlled oscillator phase controlled in dependence upon the electrical signal to which it is desired to apply a phase lead, the control loop comprising a phase lagging circuit controlled by the external voltage.

According to the invention, the system thus comprises:
- a controlled oscillator circuit, delivering an output signal of which the frequency is controlled in dependence upon a frequency control voltage,
- a phase comparison circuit, with two input terminals, delivering said frequency control voltage, and receiving at one of said input terminals the signal to which a phase advance lead is to be applied, wherein a controlled phase-pagging circuit is included in a return loop connected between the output of said controlled oscillator and the other of said input terminal of the phase comparison circuit, said frequency control voltage thus being dependent upon the phase comparison between the input signal and the lagged signal, by which the output signal of the controlled oscillator circuit is advanced in phase relative to the input signal, by an amount which is dependent upon the value of a phase control voltage.

However, phase lagging circuits of simple construction in the form in which they are used are not independent of frequency, in other words, for the same control voltage, the phase lag will vary with the frequency of the signal.

This deficiency is obviated here by using an additional phase comparison circuit which makes a correction to the external control voltage in dependence upon the phase lead created.

According to another aspect of the invention, the external control voltage does not directly attack the phase lagging circuit, and the system additionally comprises:
- a second phase comparison circuit delivering a third control voltage in dependence upon the phase comparison between the input signal to be phase-shifted and the output signal of the controlled oscillator circuit,
- a voltage comparator-amplifier circuit receiving said third control voltage and the external control voltage, said circuit delivering the second control voltage applied to the lagging circuit, this second control voltage being dependent upon the difference between the two voltages received.

The invention will be better understood and other features thereof will become apparent from the following description of one particular embodiment in conjunction withe the accompanying drawings, wherein:

FIG. 1 diagrammatically illustrates the system according to the invention.

FIG. 2 diagrammatically illustrates an improvement in said system.

The system receives a periodic input signal E and delivers an output signal S with a phase lead controlled by a control signal C emanating from a sensor (not shown).

A first phase comparator 1 receives the input signal E in the form of a periodic voltage and delivers a voltage to an integrator circuit 2 (or low-pass filter), said voltage being dependent upon the phase difference between the input signal E and the signal emanating from a controlled phase lagging circuit 3. The integrator circuit 2 deliver an averaged voltage to a controlled oscillator circuit 4. This circuit delivers a periodic output signal S of which the frequency is dependent upon the voltage delivered to it by the integrator circuit 2. The controlled phase lagging circuit 3 is connected to the output of the oscillator circuit 4 and delivers to the phase comparison circuit 1 a signal of which the phase is lagged relative to the output signal S by a phase-shift dependent upon an external voltage produced, for example, by a sensor.

All these circuits are well known among electrical engineers and are commercially available in generally integrated form. Accordingly, they will not be described in any more detail here.

The system operates as follows:

Assuming that no phase lead is applied, the output signal emanating from the oscillator 4 is controlled in phase and, hence, in frequency in dependence upon the input signal 1. This is because, in the absence of control voltage or for a control voltage corresponding to a zero lag, the lagging circuit 3 transmits to the comparison circuit 1 an identical signal which is in phase with the output signal S and the comparator 1 delivers to the oscillator circuit 4, through the filter 2, the control voltage which causes a signal to be transmitted at a given frequency. If this frequency is different from the input frequency, the comparator 1, which receives the two signals E and S, delivers to the oscillator 4 another control voltage which corrects the frequency of the signal S until it is controlled in frequency and in phase with the signal E.

If a certain phase shift is applied to the signal S returning to the comparator 1 through the lagging circuit 3 by means of a control voltage, the control voltage of the oscillator 4 produced by the comparator 1 will be modified in such a way that the signal S emanating from the oscillator circuit 4 is modified in phase until the phase-shifted signal emanating from the lagging circuit 3 is in phase with the input signal E received by the comparator 1.

It can be seen that the modification of the control voltage emanating from the comparator 1 will produce a modification in the phase of the signal S which tends to eliminate the phase shift produced in the return loop by the phase lagging circuit 3. Once this phase shift has been reached, the control voltage emanating from 1 returns to its initial value. It can also be seen that any phase lag emanating from the lagging circuit 3 produces a compensating phase lead in the oscillator circuit 4 to eliminate this lag.

Accordingly, it is possible with this system, by applying a control voltage to the phase lagging circuit 3, to advance the phase of the output signal S in relation to the input signal.

This system is simple and may be used in this form. However, the phase lagging circuits used at the present time have the disadvantage of producing phase shifts variable with frequency. For a given control voltage, the phase lag will vary with the frequency.

In order to obviate this disadvantage, the system comprises, according to an important improvement of the invention, a correcting device which modifies the control signal C in dependence upon the phase shift existing between the input signal E and the output signal S so as to render the phase shift substantially independent of the frequency.

To this end (FIG. 2), a second phase comparator 6 receives the output signal S and the input signal E and delivers a voltage dependent upon the phase shift between the signals E and S to the integrator circuit 7 which delivers the corresponding averaged voltage to the voltage comparator 5.

This comparator 5 additionally receives an external control signal in the form of the voltage C and delivers to the controlled phase lagging circuit 3 a control voltage which is dependent upon the difference between the control voltage C and the voltage emitted by the comparator 6 in response to the phase comparison between the input signal E and the output signal S. The correction thus applied to the control voltage C largely compensates the variation in the phase shift produced by the phase lagging circuit 3 in dependence upon the frequency. The manner in which this correcting voltage internenes is explained hereinafter.

The following notation is used for the phases P:

$P_1$ represents the phase of the input signal,
$P_3$ represents the phase of the phase-shifted signal issuing from the lagging circuit 3,
$P_4$ represents the phase of the output signal S,
dP represents the phase shift controlled by the lagging circuit 7 (which at equilibrium is identical with the phase shift between $P_1$ and $P_4$),
$V_3$ represents the control voltage applied to the lagging circuit 3,
$V_7$ represents the correcting voltage applied to the voltage comparator-amplifier circuit 5 emanating from the phase comparator 6 after passage through the integrator 7,
Vc represents the external control voltage emanating from a sensor,
$A_3$ represents the gain of the phase lagging circuit 3,
$A_5$ represents the gain of the voltage comparator-amplifier 5,
$A_6$ represents the gain of the phase comparator 6.

At equilibrium,
$P_1 = P_3$
with
$P_3 = P_4 - dP$, so that
$P_4 = P_1 + dP$
$dP = A_3 \cdot V_3$
$V_3 = A_5 \cdot (Vc - V_7)$
$V_7 = A_6 \cdot (P_4 - P_1) = A_6 \cdot dP$ Accordingly, by expressing dP as a function of the control voltage Vc:

$$dP = Vc \times (A_3 \cdot A_5)/(1 + A_3 \cdot A_5 \cdot A_6)$$

It is desired to eliminate as far as possible the influence of $A_3$ (gain of the phase lagging circuit 3) which varies in dependence upon the frequency of the signal.

To this end, a high value is given to the gains $A_3$ and $A_5$ so that $$dP \simeq (Vc/A_6)$$

The phase shift produced by the phase lagging circuit 3 is substantially a linear function of the control voltage Vc independent of the gain $A_3$ variable with the frequency.

The advantages of this system are numerous.

Firstly, it will be noted that the output signal is completely produced by an oscillator. Accordingly, it may have a form and characteristics which are completely independent of those of the input signal. In reality, the system does not advance a signal in phase, but creates another periodic signal of which the phase is shifted in relation to the phase of the input signal. The output signal may be of analog or digital form which enables the number of possible applications to be multiplied and simplified.

Secondly, it is simple and may readily be integrated because it does not contain any inductances. Accordingly, it is particularly reliable.

It may readily be produced by the unipolar technique or by the integrated CMOS technique so that it is largely unaffected by parasitic interference and by variations in feed voltage.

By virtue of the fact that the relooping process is used, there is no need to use elements with precise characteristics, so that manufacturing costs are low.

The discrete components which have to be used (and especially the capacitors) will have relatively low values which reflects favourably on their cost.

It may be directly attacked by a signal of low amplitude of the order of 0.1 volt for example, which simplifies its feed for certain applications.

In addition, the phase shift is obtained by a simple variation in voltage and, hence, only requires low power.

By virtue of these advantages, especially those concerning its robustness, its low cost, its resistance to parasitic interference and the moderate nature of its power consumption, this system is particularly suitable for use in vehicles, especially for controlling the ignition advance of internal combustion engines in dependence upon various parameters, such as speed and the reduced pressure prevailling in the intake manifold. The ignition signal itself is produced by another known system which is controlled by the position of the components of the engine. It is known how to apply a phase lead to this ignition signal as a function of speed, and the system according to the invention enables another phase lead to be created in dependence upon the reduced pressure for the suction stroke. The sensor used may be a device creating a variation in voltage in dependence upon the deformation of a membrane. There are various devices of this type, using in particular semiconductor strain gauges.

Other applications are possible each time it is necessary to apply a phase lead to a signal in dependence upon various parameters, said lead optionally being dependent on or independent of the frequency of the signal.

Of course the invention is not limited to the embodiment described and shown which was given solely by way of example.

What is claimed:

1. A system for advancing in phase an electrical signal under the control of an external voltage, comprising:

a control oscillator circuit, delivering an output signal of which the frequency is controlled in dependence upon a frequency control voltage;

a phase comparison circuit, with two input terminals delivering said frequency control voltage, and receiving at one of said input terminals the signal to which a phase advance lead is to be applied;

a controlled phase delay circuit included in a return loop connected between the output of said controlled oscillator and the other of said input terminals of the phase comparison circuit, said frequency control voltage thus being dependent upon the phase comparison between the input signal and the delayed signal, by which the output signal of the controlled oscillator circuit is advanced in phase relative to the input signal, by an amount which is dependent upon the value of a phase control voltage, said phase control voltage being provided by said external voltage through a correcting circuit, wherein said correcting circuit is formed by:

a second phase comparison circuit which delivers a correcting voltage in dependence upon the phase comparison between the input signal to be phase-shifted and the output signal of the controlled oscillator circuit;

a voltage comparator-amplifier circuit which respectively receives at its inputs said correcting voltage and the external control voltage, said circuit thus delivering a voltage which is dependent upon the difference between the two voltages received, and which constitutes said phase-control voltage applied to said phase-delay controlled circuit, by which the phase delay, introduced by the controlled phase delay circuit, is substantially independent of the frequency of the output signal.

* * * * *